United States Patent
Ahn et al.

(10) Patent No.: US 9,609,753 B2
(45) Date of Patent: Mar. 28, 2017

(54) MULTILAYER CERAMIC CAPACITOR AND BOARD FOR MOUNTING OF THE SAME

(71) Applicant: SAMSUNG ELECTRO-MECHANICS CO., LTD., Suwon-Si, Gyeonggi-Do (KR)

(72) Inventors: Young Ghyu Ahn, Suwon-Si (KR); Doo Young Kim, Suwon-Si (KR); Min Cheol Park, Suwon-Si (KR); Byoung Hwa Lee, Suwon-Si (KR); Sang Soo Park, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 238 days.

(21) Appl. No.: 14/327,277

(22) Filed: Jul. 9, 2014

(65) Prior Publication Data

US 2015/0014040 A1 Jan. 15, 2015

(30) Foreign Application Priority Data

Jul. 11, 2013 (KR) .................. 10-2013-0081736
Jun. 27, 2014 (KR) .................. 10-2014-0079965

(51) Int. Cl.
*H01G 4/228* (2006.01)
*H05K 1/18* (2006.01)
(Continued)

(52) U.S. Cl.
CPC ............ *H05K 1/181* (2013.01); *H01G 2/065* (2013.01); *H01G 4/012* (2013.01); *H01G 4/12* (2013.01);
(Continued)

(58) Field of Classification Search
CPC . H01C 1/148; H01C 7/18; H01C 7/13; H05K 1/111; H05K 1/18; H05K 1/181;
(Continued)

(56) References Cited

U.S. PATENT DOCUMENTS 7,843,679 B2  11/2010  Togashi
7,974,071 B2  7/2011  Togashi
(Continued)

FOREIGN PATENT DOCUMENTS

JP      2013-55321 A    3/2013
KR  10-2006-0073274 A   6/2006
(Continued)

OTHER PUBLICATIONS

Korean Office Action issued in Korean Application No. 10-2014-0079965, dated Jan. 12, 2016, With English Translation.
(Continued)

*Primary Examiner* — Timothy Thompson
*Assistant Examiner* — Guillermo Egoavil
(74) *Attorney, Agent, or Firm* — McDermott Will & Emery LLP

(57) ABSTRACT

A multilayer ceramic capacitor may include three external electrodes disposed on a mounting surface of a ceramic body and spaced apart from each other, and first and second lead-out portions extended from a first internal electrode so as to be exposed through the mounting surface of the ceramic body and spaced apart from each other in a length direction of the ceramic body have one or more space portions, respectively, and a board for mounting thereof is provided.

26 Claims, 8 Drawing Sheets

(51) Int. Cl.
*H01G 4/30* (2006.01)
*H01G 2/06* (2006.01)
*H01G 4/012* (2006.01)
*H01G 4/12* (2006.01)
*H05K 1/11* (2006.01)

(52) U.S. Cl.
CPC ............... *H01G 4/228* (2013.01); *H01G 4/30* (2013.01); *H05K 1/111* (2013.01); *H05K 2201/10015* (2013.01); *Y02P 70/611* (2015.11)

(58) Field of Classification Search
CPC .... H05K 1/0231; H05K 1/185; H05K 3/4602; H05K 3/3442; H05K 7/00; H05K 2201/10636; H05K 2201/10674; H01G 2/065; H01G 4/005; H01G 4/06; H01G 4/228; H01G 4/232; H01G 4/248; H01G 4/2325; H01G 4/30; H01G 4/12; H01G 4/224; H01L 23/645; H01L 21/4857; H01L 24/16; H01L 2924/01005; H01L 2924/01019; H01L 2924/01082; H01L 2924/01025; H01L 2924/01078; H01L 2924/01052; H01L 2924/15312; H01L 2224/82039; H01L 25/16; H01L 41/0471; H01L 41/047; Y02P 70/613; Y02P 70/611; Y10T 29/435
USPC ......... 174/261, 258; 310/311, 366; 336/200; 338/22 R, 21; 361/321.2, 301.3, 764, 361/301.4, 306.3, 321.1, 306.1, 305, 311, 361/309, 303
See application file for complete search history.

(56) References Cited

U.S. PATENT DOCUMENTS

| | | | |
|---|---|---|---|
| 2006/0139849 A1 | 6/2006 | Yoon et al. | |
| 2008/0080120 A1* | 4/2008 | Togashi | H01G 4/012 361/301.4 |
| 2008/0080121 A1* | 4/2008 | Togashi | H01G 4/012 361/303 |
| 2008/0144253 A1* | 6/2008 | Togashi | H01G 4/30 361/301.4 |
| 2008/0186652 A1* | 8/2008 | Lee | H01G 4/012 361/306.3 |
| 2009/0015986 A1* | 1/2009 | Togashi | H01G 4/012 361/321.4 |
| 2009/0086406 A1* | 4/2009 | Lee | H01G 4/228 361/306.3 |
| 2010/0149769 A1* | 6/2010 | Lee | H01G 2/065 361/768 |
| 2010/0321860 A1 | 12/2010 | Osawa | |
| 2011/0056735 A1* | 3/2011 | Lee | H01G 4/005 174/260 |
| 2012/0050939 A1* | 3/2012 | Si | H01G 4/012 361/303 |
| 2013/0058006 A1 | 3/2013 | Kim | |

FOREIGN PATENT DOCUMENTS

| | | |
|---|---|---|
| KR | 10-0593930 B1 | 6/2006 |
| KR | 10-2008-0073193 A | 8/2008 |
| KR | 10-0920614 B1 | 10/2009 |

OTHER PUBLICATIONS

U.S. Office Action issued in U.S. Appl. No. 14/841,126, dated Jul. 28, 2016.
Third Party Submission under 37 CFR 1.290 issued in U.S. Appl. No. 14/841,126 dated Jun. 23, 2016.
Notice of Allowance issued in U.S. Appl. No. 14/841,126, dated Jan. 3, 2017.

* cited by examiner

MULTILAYER CERAMIC CAPACITOR AND BOARD FOR MOUNTING OF THE SAME

CROSS-REFERENCE TO RELATED APPLICATION

This application claims the benefit of Korean Patent Application No. 10-2013-0081736 filed on Jul. 11, 2013 and Korean Patent Application No. 10-2014-0079965 filed on Jun. 27, 2014 with the Korean Intellectual Property Office, the disclosures of which are incorporated herein by reference.

BACKGROUND

The present disclosure relates to a multilayer ceramic capacitor and a board for mounting of the same.

An example of electronic components using a ceramic material includes capacitors, inductors, piezoelectric elements, varistors, thermistors, and the like.

Among the ceramic electronic components, a multilayer ceramic capacitor (MLCC) has advantages in that it has a small size and a high capacitance and is easily mounted, and is usefully employed as a decoupling capacitor disposed in a high frequency circuit such as a power supply circuit of a large scale integrated circuit (LSI), or the like.

Here, stability of the power supply circuit depends on an equivalent series inductance (ESL) of the multilayer ceramic capacitor and is relatively high, particularly in a low ESL.

Therefore, in order to stabilize the power supply circuit, the multilayer ceramic capacitor should have a low level of ESL. This demand has further increased in accordance with the trend toward an increase in a frequency and a current of an electronic apparatus.

In addition, the multilayer ceramic capacitor is also used as an electromagnetic interference (EMI) filter as well as being used as the decoupling capacitor. In this case, the ESL needs to be relatively low in order to remove high frequency noise and improve attenuation characteristics.

In order to decrease ESL, a three-terminal type capacitor in which internal electrodes are mounted to be perpendicular to a surface of a board, and dielectric layers formed using a ceramic material and internal electrodes formed using a metal are alternately stacked in corner portions and both end surfaces of a ceramic body has been partially disclosed.

However, in the three-terminal type multilayer ceramic capacitor, since coupling force between the dielectric layer and the internal electrode is relatively weak, there was a problem that delamination occurs in the corner portions and both end surfaces of the ceramic body.

SUMMARY

An exemplary embodiment in the present disclosure may provide a multilayer ceramic capacitor capable of decreasing an equivalent series inductance (ESL) and preventing occurrence of delamination in corner portions of a ceramic body and both end surfaces of the ceramic body in a length direction, and a board for mounting of the same.

According to an exemplary embodiment in the present disclosure, a multilayer ceramic capacitor in which three external electrodes are disposed on a mounting surface of a ceramic body to be spaced apart from each other, and first and second lead-out portions extended from a first internal electrode so as to be exposed through the mounting surface of the ceramic body and spaced apart from each other in a length direction of the ceramic body have one or more space portions, respectively, and a board for mounting thereof, may be provided.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
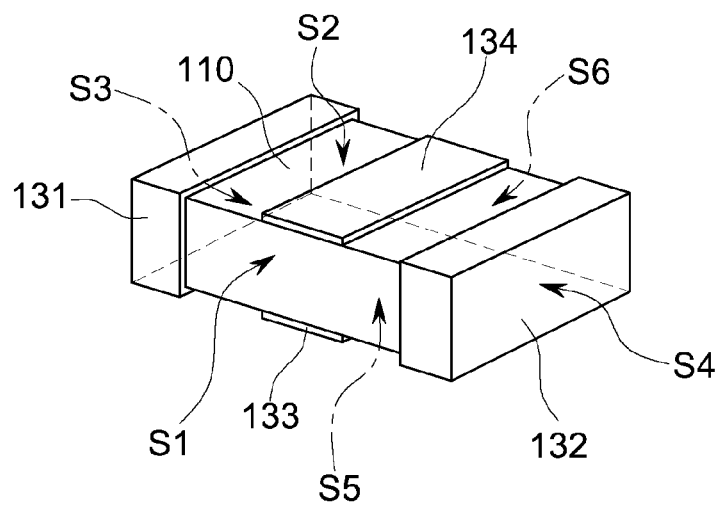
FIG. 1 is a perspective view schematically illustrating a multilayer ceramic capacitor according to an exemplary embodiment of the present disclosure.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

Multilayer Ceramic Capacitor

Figure 2:
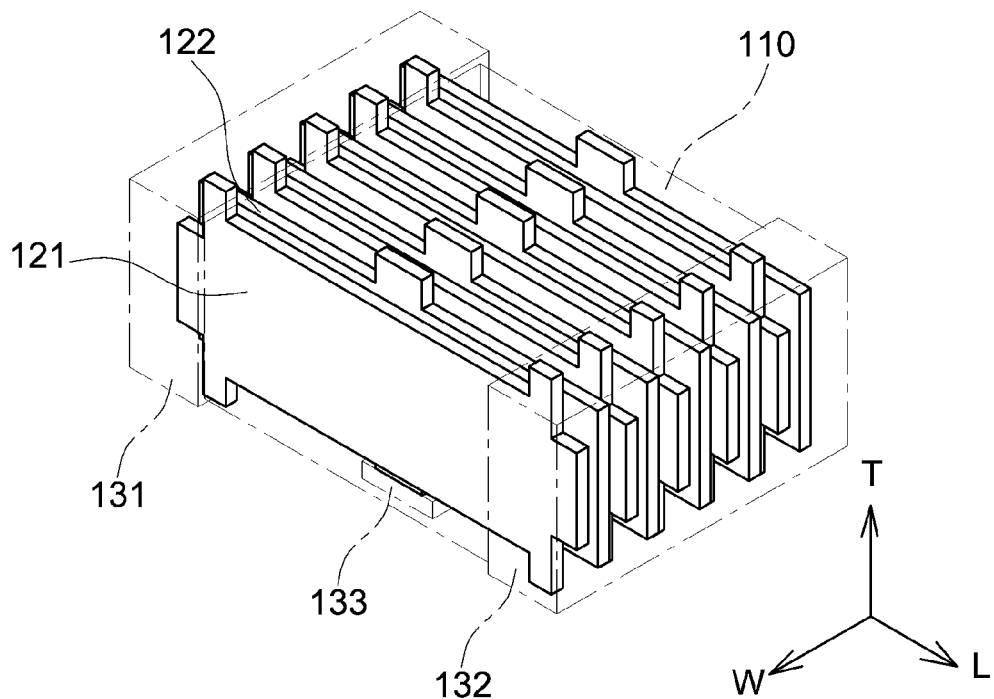
FIG. 2 is a transparent perspective view illustrating a structure of internal electrodes of a multilayer ceramic capacitor according to an exemplary embodiment of the present disclosure.

FIG. 1 is a perspective view schematically illustrating a multilayer ceramic capacitor according to an exemplary embodiment of the present disclosure; and FIG. 2 is a transparent perspective view illustrating a structure of internal electrodes of the multilayer ceramic capacitor according to an exemplary embodiment of the present disclosure.

Referring to FIGS. 1 and 2, a multilayer ceramic capacitor 100 according to an exemplary embodiment of the present disclosure may include a ceramic body 110, a plurality of first and second internal electrodes 121 and 122, first to third lead-out portions 123 to 125, and first to third external electrodes 131 to 133 formed on a mounting surface of the ceramic body 110.

The ceramic body 110 may be formed by stacking a plurality of dielectric layers 111 in a width direction and then sintering the plurality of dielectric layers 111. Adjacent dielectric layers 111 may be integrated with each other so that boundaries therebetween are not readily apparent without using a scanning electron microscope (SEM).

A shape of the ceramic body 110 is not particularly limited. For example, the ceramic body 110 may have a hexahedral shape.

A direction of a hexahedron of the ceramic body 110 will be defined in order to clearly describe exemplary embodiments of the present disclosure. L, W and T shown in FIG. 2 refer to a length direction, a width direction, and a thickness direction, respectively.

Further, in the present exemplary embodiment, for convenience of explanation, surfaces of the ceramic body 110 opposing each other in the thickness direction will be defined as first and second main surfaces S1 and S2, both surfaces of the ceramic body 110 connecting the first and second main surfaces S1 and S2 to each other and opposing each other in the length direction will be defined as first and second end surfaces S3 and S4, and both surfaces of the ceramic body 110 opposing each other in the width direction will be defined as third and fourth side surfaces S5 and S6.

The dielectric layer 111 may contain a high-k ceramic material, for example, a barium titanate ($BaTiO_3$) based ceramic powder, or the like. However, the present disclosure is not limited thereto as long as sufficient capacitance may be obtained.

In addition, the dielectric layer 111 may further contain ceramic additives, organic solvents, plasticizers, binders, dispersants, and the like, as needed, in addition to the ceramic powder.

The ceramic additives may contain a transition metal oxide or carbide, rare earth elements, magnesium (Mg), aluminum (Al), or the like.

Figure 3A:
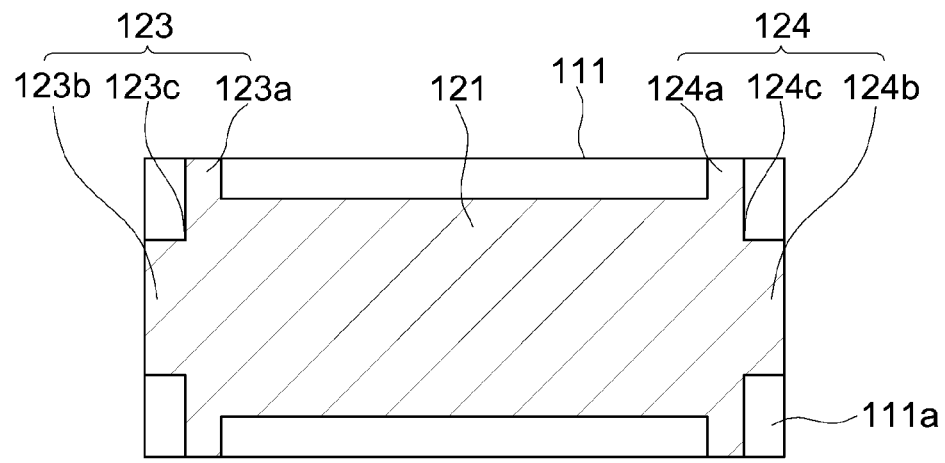
FIGS. 3A and 3B are plan views illustrating first and second internal electrodes of a multilayer ceramic capacitor according to an exemplary embodiment of the present disclosure.
Figure 3B:
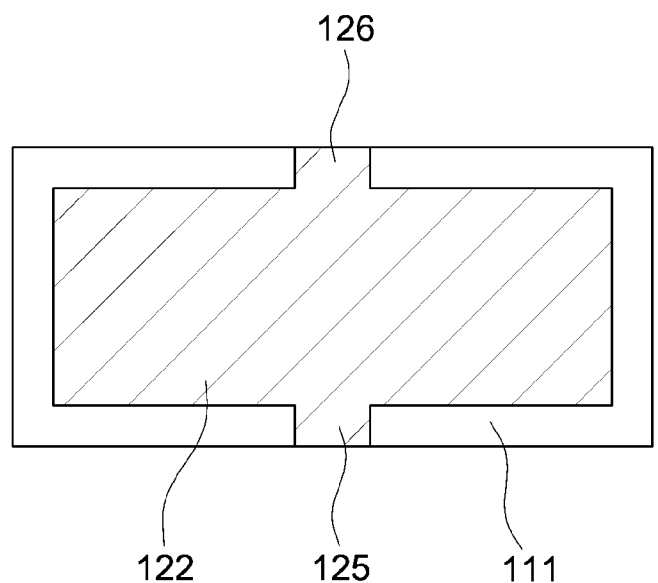

FIGS. 3A and 3B are plan views illustrating first and second internal electrodes of the multilayer ceramic capacitor according to an exemplary embodiment of the present disclosure.

Referring to FIGS. 3A and 3B, the first and second internal electrodes 121 and 122, having different polarities, may be alternately disposed to face each other with each of ceramic sheets disposed therebetween, and may overlap with each other in a stacked direction to contribute to capacitance of the capacitor, and the ceramic sheets may form the dielectric layers 111.

The first and second internal electrodes 121 and 122 may be electrically insulated from each other by the dielectric layer 111 disposed therebetween.

In addition, the first and second internal electrodes 121 and 122 may be formed using a conductive material, for example, one of silver (Ag), palladium (Pd), platinum (Pt), nickel (Ni), and copper (Cu) or an alloy thereof. However, the present disclosure is not limited thereto.

The first and second lead-out portions 123 and 124, extended from the first internal electrode 121 so as to be exposed through at least one surface of the ceramic body 110, may have at least one or more space portions 123c and 124c, and include a pair of first exposed portions 123a and 124a exposed from the first internal electrode 121 through the first main surface S1 of the ceramic body 110, which is the mounting surface of the ceramic body 110, and second exposed portions 123b and 124b extended to be exposed through the first and second end surfaces S3 and S4 of the ceramic body 110 opposing each other in the length direction, respectively.

Here, the space portions 123c and 124c, corresponding to portions in which ceramic materials having high coupling force contact each other, are secured in corner portions and the first and second end surfaces S3 and S4 of the ceramic body 110 in the length direction, and delamination occurring in the corner portions and the first and second end surfaces S3 and S4 of the ceramic body 110 may be significantly decreased.

Here, the space portions 123c and 124c may have a form in which they are exposed through at least one surface of the dielectric layer forming the ceramic body 110. In the present exemplary embodiment, the space portions 123c and 124c may be formed in positions corresponding to those of the corner portions of the dielectric layer 111 between the first exposed portions 123a and 124a and the second exposed portions 123b and 124b. However, the present disclosure is not limited thereto.

The third lead-out portion 125 may be disposed between the first and second lead-out portions 123 and 124 and be extended from the second internal electrode 122 so as to be exposed through the first main surface S1 of the ceramic body 110.

The first and second external electrodes 131 and 132, having the same polarity, may be formed on the first main surface S1 of the ceramic body 110. In the present exemplary embodiment, the first and second external electrodes 131 and 132 may be extended to the first and second end surfaces S3 and S4 of the ceramic body 110 in the length direction and may contact the first and second lead-out portions 123 and 124 exposed through the first main surface S1 and the first and second end surfaces S3 and S4 of the ceramic body 110, respectively, to thereby be electrically connected to the first and second lead-out portions 123 and 124.

For example, since a relatively wide contact area between the first and second lead-out portions 123 and 124 and the first and second external electrodes 131 and 132 over the first and second end surfaces S3 and S4 and the first main surface S1 of the ceramic body 110 is secured, an effect of decreasing an equivalent series inductance (ESL) may be obtained.

Here, the first to third external electrodes 131 to 133 may be extended to portions of the third and fourth side surfaces S5 and S6 of the ceramic body 110 in the width direction or be extended to the second main surface S2 of the ceramic body 110 and may be formed in a form in which they completely cover both end portions of the ceramic body 110, as needed.

The third external electrode 133, having a polarity different from those of the first and second external electrodes 131 and 132, may be formed on the first main surface S1 of the ceramic body 110 between the first and second external electrodes 131 and 132 and may contact the third lead-out portion 125 exposed through the first main surface S1 of the ceramic body 110 to thereby be electrically connected to the third lead-out portion 125.

Here, the first to third external electrodes 131 to 133 may be formed using a conductive metal, for example, silver (Ag), nickel (Ni), copper (Cu), or the like. The first to third external electrodes 131 to 133 may be formed by applying and sintering a conductive paste prepared by adding glass frits to a conductive metal powder. However, the present disclosure is not limited thereto.

In addition, a plating layer (not shown) may be formed on the first to third external electrodes 131 to 133, as needed. The plating layer is to increase adhesion strength between the multilayer ceramic capacitor 100 and a printed circuit board when the multilayer ceramic capacitor 100 is mounted on the printed circuit board using a solder.

The plating layer may include, for example, a nickel (Ni) plating layer formed on the first to third external electrodes 131 to 133 and a tin (Sn) plating layer formed on the nickel plating layer. However, the present disclosure is not limited thereto.

Meanwhile, the first and second lead-out portions 123 and 124 may be extended so that the first exposed portions 123a and 124a are further exposed from the first internal electrode 121 through the second main surface S2 of the ceramic body 110.

In addition, a fourth lead-out portion 126 may be further formed to be extended so as to be exposed from the second internal electrode 122 through the second main surface S2 of the ceramic body 110.

The fourth lead-out portion 126 may be disposed between the first and second lead-out portions 123 and 124 so as to be spaced apart from the first and second lead-out portions 123 and 124.

Here, a fourth external electrode 134 may be formed on the second main surface S2 of the ceramic body 110 between the first and second external electrodes 131 and 132.

The fourth external electrode 134 may contact a portion of the fourth lead-out portion 126 exposed through the second main surface S2 of the ceramic body 110 to thereby be electrically connected to the exposed portion.

As described above, in the case in which the first and second lead-out portions 123 and 124 and the fourth lead-out portion 126 are led to the second main surface S2 of the ceramic body 110 to form internal and external structures of the multilayer ceramic capacitor 100 as a vertically symmetrical structure, directivity of the capacitor may be removed.

Therefore, since any of the first and second main surfaces S1 and S2 may be provided as amounting surface at the time of surface-mounting the capacitor, a direction of the mounting surface at the time of mounting the multilayer ceramic capacitor 100 on the board needs not to be considered.

Figure 4:
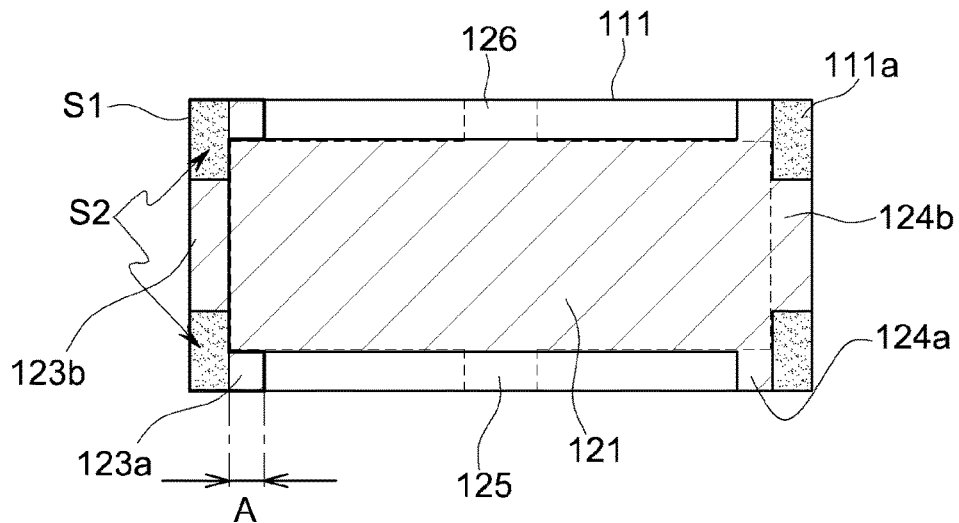
FIG. 4 is a plan view illustrating a total area S2 of a space portion of a multilayer ceramic capacitor according to an exemplary embodiment of the present disclosure and an area S1 corresponding to the sum of first or second lead-out portions and the space portion.

FIG. 4 is a plan view illustrating an area of a space portion of the multilayer ceramic capacitor according to an exemplary embodiment of the present disclosure and an area corresponding to the sum of the lead-out portions and the space portion, and the following Table 1 illustrates whether or not delamination occurs depending on a value of S2/S1 and value A to be described below and an ESL value.

TABLE 1

| Sample | S1 ($\mu m^2$) | S2 ($\mu m^2$) | S2/S1 | A ($\mu m$) | Delamination occurrence rate (%) | ESL (pH) |
|---|---|---|---|---|---|---|
| 1 | 36024 | 0 | 0.0% | 125.4 | 4.5 | 52.2 |
| 2 | 36023 | 1915 | 5.3% | 125.2 | 1.0 | 52.3 |
| 3 | 36028 | 2144 | 6.0% | 100.4 | 0.5 | 52.8 |
| 4 | 36018 | 3592 | 10.0% | 100.1 | 0.0 | 52.9 |
| 5 | 36032 | 3587 | 10.0% | 99.8 | 0.0 | 52.9 |
| 6 | 36034 | 3589 | 10.0% | 85.5 | 0.0 | 53.1 |
| 7 | 36011 | 10048 | 27.9% | 85.0 | 0.0 | 53.2 |
| 8 | 36025 | 15844 | 44.0% | 85.1 | 0.0 | 53.2 |
| 9 | 36018 | 23250 | 64.6% | 85.4 | 0.0 | 53.4 |
| 10 | 36030 | 28827 | 80.0% | 85.2 | 0.0 | 53.7 |
| 11 | 36009 | 28833 | 80.1% | 52.4 | 0.0 | 54.0 |
| 12 | 36025 | 28848 | 80.1% | 48.2 | 0.0 | 54.3 |
| 13 | 36019 | 32467 | 90.1% | 36.0 | 0.0 | 54.9 |
| 14 | 36022 | 34562 | 95.9% | 28.3 | 0.0 | 60.2 |

Referring to FIG. 4 and Table 1, when a total area of the space portion 123c or 124c included in the first or second lead-out portion 123 or 124 is S2 and an area corresponding to the sum of an area of the first or second lead-out portion 123 or 124 and S2 is S1, S2/S1 may satisfy the range of 10.0% to 90.1% as in Samples 4 to 13 of Table 1.

When the value of S2/S1 is less than 10.0%, delamination may occur as in Samples 1 to 3 of Table 1, and when the value of S2/S1 exceeds 90.1%, an ESL value exceeds 55 as in Sample 14 of Table 1, such that it may be difficult to implement a relatively low level of ESL.

When a minimum width of the first or second lead-out portion 123 or 124, for example, a width of the first exposed portion 123a or 124a in the present exemplary embodiment, is A, A may satisfy the range of 36.0 $\mu m \leq A \leq 100.1$ $\mu m$ as in Samples 4 to 13 of Table 1.

When the value A is less than 36.0 $\mu m$, it may be difficult to implement the relatively low level of ESL as in Sample 14 of Table 1, and when the value A exceeds 100.1 $\mu m$, the delamination may occur as in Samples 1 to 3 of Table 1.

In addition, when a width of a band part of the first or second external electrode 131 or 132, for example, a width of a portion formed on the second main surface, which is a mounting surface of the ceramic body 110, is defined as B, the value A may be equal to or less than the value B.

Here, in a case in which the value A is larger than the value B, the internal electrode is externally exposed, such that reliability may be significantly decreased due to permeation of a plating solution, permeation of external moisture, and the like, in a plating process.

Modified Example

Figure 5:
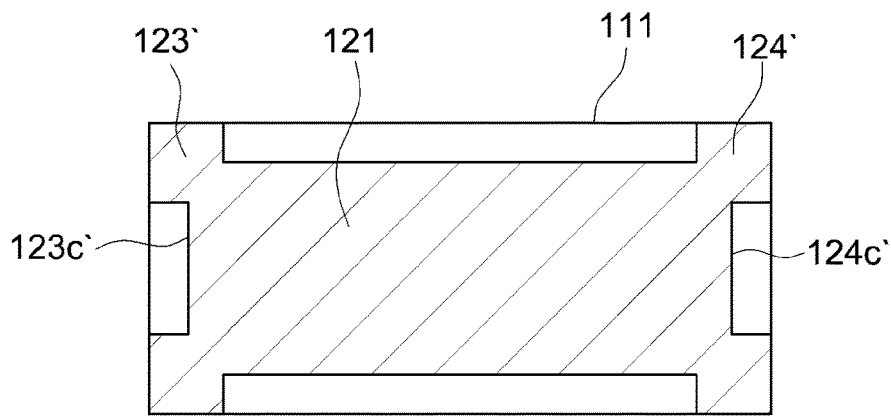
FIG. 5 is a plan view illustrating another example of a first internal electrode of the multilayer ceramic capacitor according to an exemplary embodiment of the present disclosure.

FIG. 5 is a plan view illustrating another example of a first internal electrode of the multilayer ceramic capacitor according to an exemplary embodiment of the present disclosure.

Here, since a structure in which the ceramic body 110, the first and second internal electrodes 121 and 122, the first to third external electrodes 131 to 133, and the like, are formed is the same as that of the foregoing exemplary embodiment of the present disclosure, a detailed description thereof will be omitted so as to avoid an overlapping description, and first and second lead-out portions 123' and 124' having a structure different from that of the foregoing exemplary embodiment of the present disclosure will be described in detail.

Referring to FIG. 5, the first and second lead-out portions 123' and 124' may be formed in positions corresponding to corner portions of the dielectric layer 111 and be formed in positions corresponding to upper and lower corner portions vertically opposing each other, respectively, as needed.

Therefore, a space portion 123c' or 124c' may be positioned between the first or second lead-out portions 123' or 124' formed in upper and lower corner portions of the first internal electrode 121 and may be formed so as to be exposed through the first or second end surface of the dielectric layer 111 in the length direction.

Figure 6:
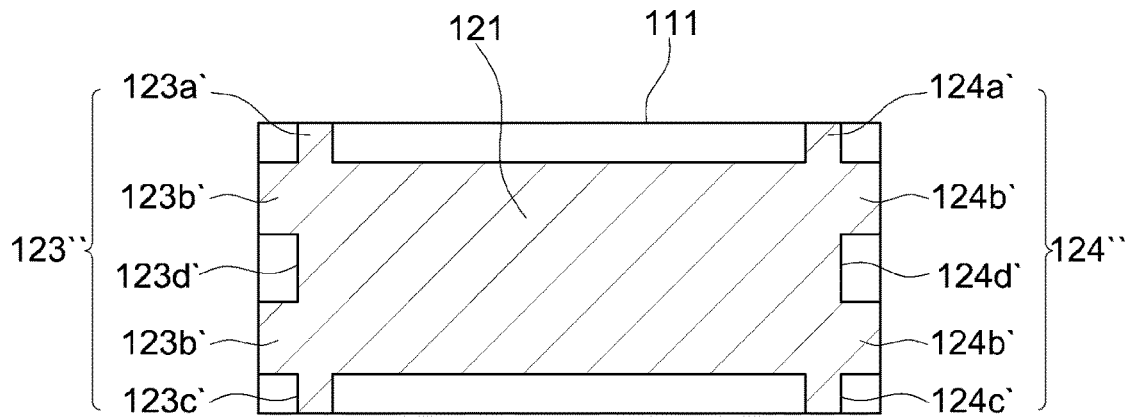
FIG. 6 is a plan view illustrating another example of a first internal electrode of the multilayer ceramic capacitor according to an exemplary embodiment of the present disclosure.

FIG. 6 is a plan view illustrating another example of a first internal electrode of the multilayer ceramic capacitor according to an exemplary embodiment of the present disclosure.

Here, since a structure in which the ceramic body 110, the first and second internal electrodes 121 and 122, the first to third external electrodes 131 to 133, and the like, are formed is the same as that of the foregoing exemplary embodiment of the present disclosure, a detailed description thereof will be omitted so as to avoid an overlapping description, and first and second lead-out portions 123" and 124" having a structure different from that of the foregoing exemplary embodiment of the present disclosure will be described in detail.

Referring to FIG. 6, the first and second lead-out portions 123" and 124" may include first exposed portions 123a' and 124a' exposed through the first and second main surfaces of the dielectric layer 111 and a plurality of second exposed portions 123b' and 124b' exposed through the first and second end surfaces of the dielectric layer 111.

Here, first space portions 123c' and 124c' may be provided between the first exposed portions 123a' and 124a' and the second exposed portions 123b' and 124b', for example, in positions corresponding to upper and lower corner portions of the dielectric layer 111, respectively, and second space portions 123d' and 124d' may be provided between the respective second exposed portions 123b' and 124b' so as to be exposed through the first and second end surfaces of the dielectric layer 111, respectively.

Figure 7:
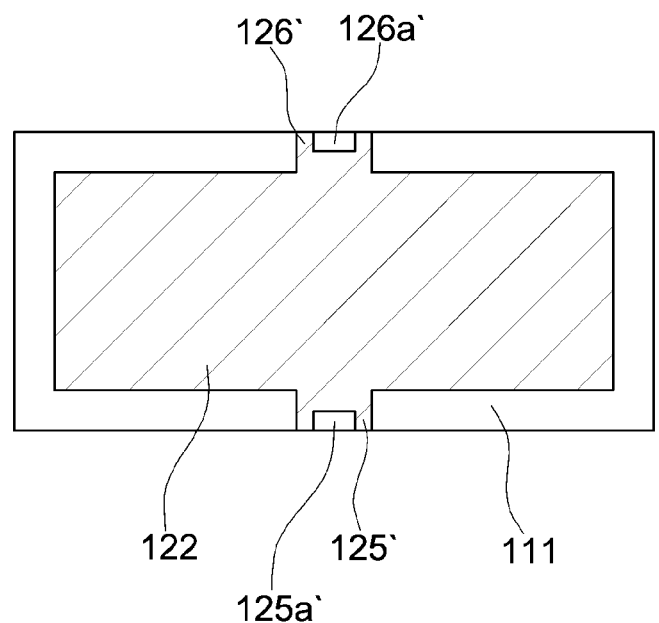
FIG. 7 is a plan view illustrating another example of a second internal electrode of the multilayer ceramic capacitor according to an exemplary embodiment of the present disclosure.

FIG. 7 is a plan view illustrating another example of a second internal electrode of the multilayer ceramic capacitor according to an exemplary embodiment of the present disclosure.

Here, since a structure in which the ceramic body 110, the first and second internal electrodes 121 and 122, the first to third external electrodes 131 to 133, and the like, are formed is the same as that of the foregoing exemplary embodiment of the present disclosure, a detailed description thereof will be omitted so as to avoid an overlapping description, and third and fourth lead-out portions 125' and 126' having a structure different from that of the foregoing exemplary embodiment of the present disclosure will be described in detail.

Meanwhile, referring to FIG. 7, the third and fourth lead-out portions 125' and 126' may have one or more space portion 125a' and 126a', respectively, so as to be exposed through the first and second main surfaces of the dielectric layer 111, respectively.

Figure 8:
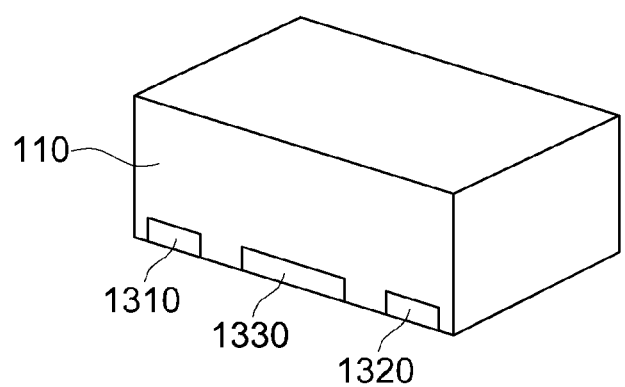
FIG. 8 is a perspective view illustrating another example of an external electrode of the multilayer ceramic capacitor according to an exemplary embodiment of the present disclosure.
Figure 9A:
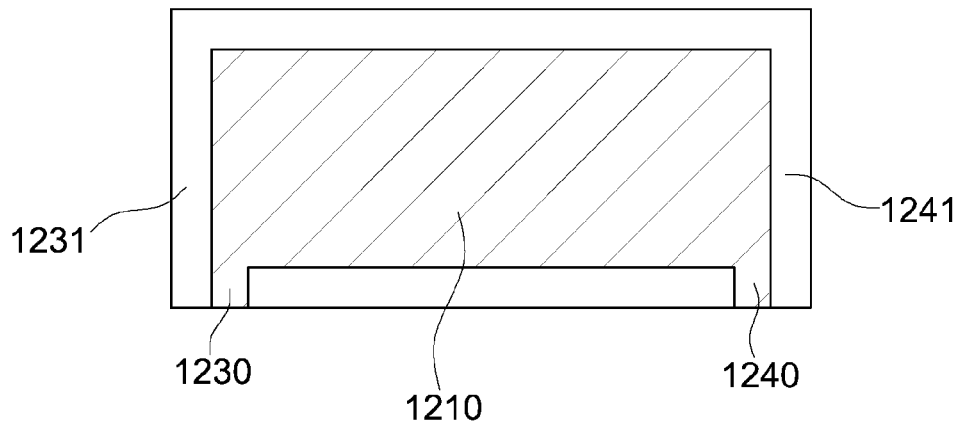
FIGS. 9A and 9B are plan views illustrating another example of first and second internal electrodes of the multilayer ceramic capacitor of FIG. 8.
Figure 9B:
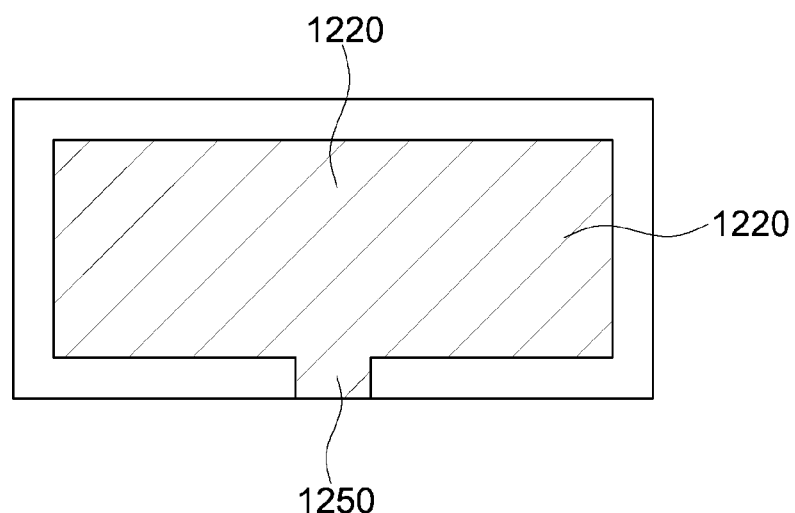

FIG. 8 is a perspective view illustrating another example of an external electrode of the multilayer ceramic capacitor according to an exemplary embodiment of the present disclosure; and FIGS. 9A and 9B are plan views illustrating another example of first and second internal electrodes of the multilayer ceramic capacitor of FIG. 8.

Here, since a structure of the ceramic body 110 is the same as that of the foregoing exemplary embodiment of the present disclosure, a detailed description thereof will be omitted so as to avoid an overlapping description, and first to third external electrodes 1310 to 1330 and first and second internal electrodes 1210 and 1220 having a structure different from that of the foregoing exemplary embodiment of the present disclosure will be described in detail.

Referring to FIGS. 8 through 9B, the first to third external electrodes 1310 to 1330 may be formed only on the bottom surface of the ceramic body 110 and be extended to portions of the third and fourth side surfaces of the ceramic body 110, as needed.

In addition, the first internal electrode 1210 may include first and second lead-out portions 1230 and 1240 exposed through the bottom surface of the ceramic body 110 to thereby be electrically connected to the first and second external electrodes 1310 and 1320, respectively.

Here, the first internal electrode 1210 may include space portions 1231 and 1241 formed on both end portions thereof in the length direction.

The second internal electrode 1220 may include a third lead-out portion 1250 positioned between the first and second lead-out portions 1230 and 1240 and exposed through the bottom surface of the ceramic body 110 to thereby be electrically connected to the third external electrode 1330.

Figure 10:
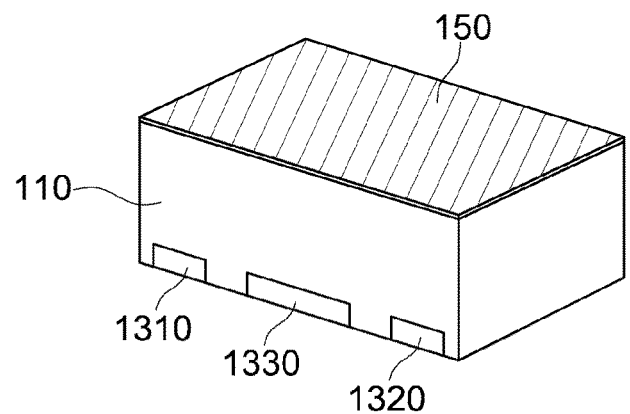
FIG. 10 is a perspective view illustrating another example of an external electrode of the multilayer ceramic capacitor according to an exemplary embodiment of the present disclosure.
Figure 11A:
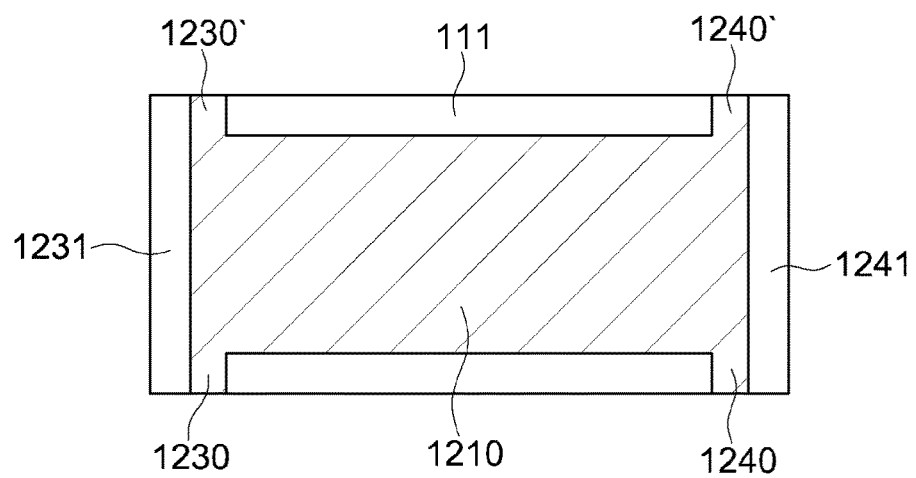
FIGS. 11A and 11B are plan views illustrating another example of first and second internal electrodes of the multilayer ceramic capacitor of FIG. 10.
Figure 11B:
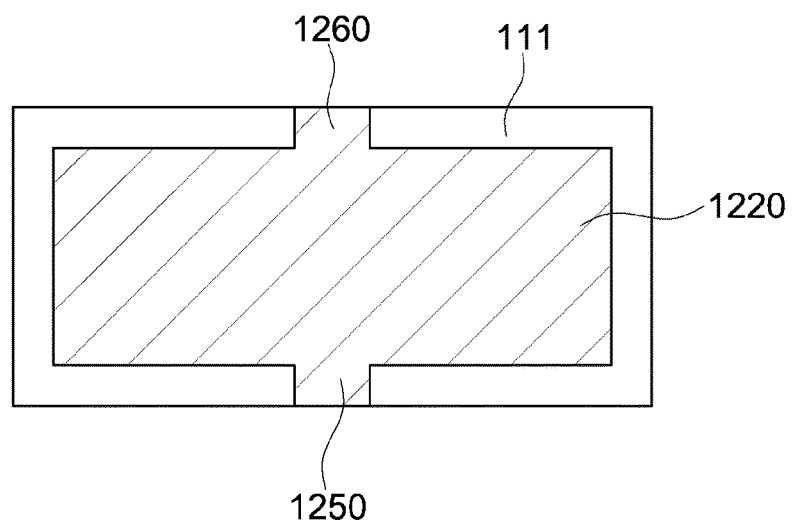

FIG. 10 is a perspective view illustrating another example of an external electrode of the multilayer ceramic capacitor according to an exemplary embodiment of the present disclosure; and FIGS. 11A and 11B are plan views illustrating another example of first and second internal electrodes of the multilayer ceramic capacitor of FIG. 10.

Here, since a structure of the ceramic body 110 is the same as that of the foregoing exemplary embodiment of the present disclosure, a detailed description thereof will be omitted so as to avoid an overlapping description, and first to third external electrodes 1310 to 1330 and first and second internal electrodes 1210 and 1220 having a structure different from that of the foregoing exemplary embodiment of the present disclosure will be described in detail.

Referring to FIGS. 10 through 11B, the first to third external electrodes 1310 to 1330 may be extended to portions of the third and fourth side surfaces of the ceramic body 110, respectively, as needed.

In addition, an insulating layer 150 may be disposed on the top surface S2 of the ceramic body 110 opposing the mounting surface of the ceramic body 110.

The first internal electrode 1210 may include first and second lead-out portions 1230 and 1240 exposed through the bottom surface of the ceramic body 110 to thereby be electrically connected to the first and second external electrodes 1310 and 1320, respectively.

In addition, the first internal electrode 1210 may have fourth and fifth lead-out portions 1230' and 1240' exposed through the top surface of the ceramic body 110 to thereby contact the insulating layer 150 formed on the top surface of the ceramic body 110.

Here, the first internal electrode 1210 may include space portions 1231 and 1241 formed on both end portions thereof in the length direction.

The second internal electrode 1220 may include a third lead-out portion 1250 exposed through the bottom surface of the ceramic body 110 between the first and second lead-out portions 1230 and 1240 to thereby be electrically connected to the third external electrode 1330 and a sixth lead-out portion 1260 exposed through the top surface of the ceramic body 110 between the fourth and fifth lead-out portions 1230' and 1240' to thereby contact the insulating layer 150.

Figure 12:
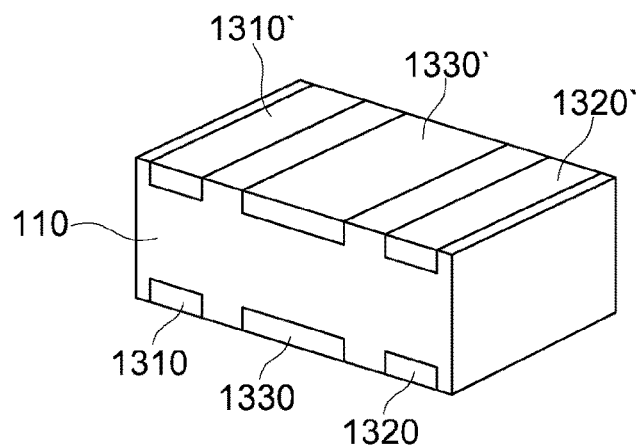
FIG. 12 is a perspective view illustrating another example of an external electrode of the multilayer ceramic capacitor according to an exemplary embodiment of the present disclosure.
Figure 13A:
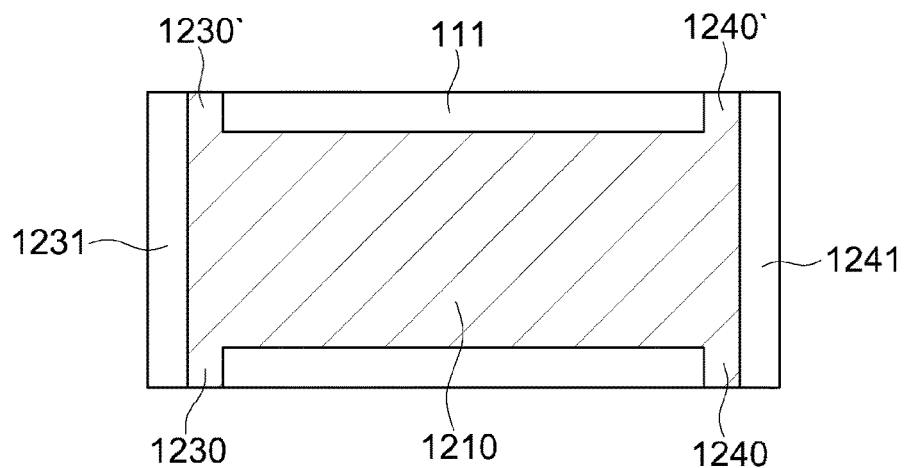
FIGS. 13A and 13B are plan views illustrating another example of first and second internal electrodes of the multilayer ceramic capacitor of FIG. 12.
Figure 13B:
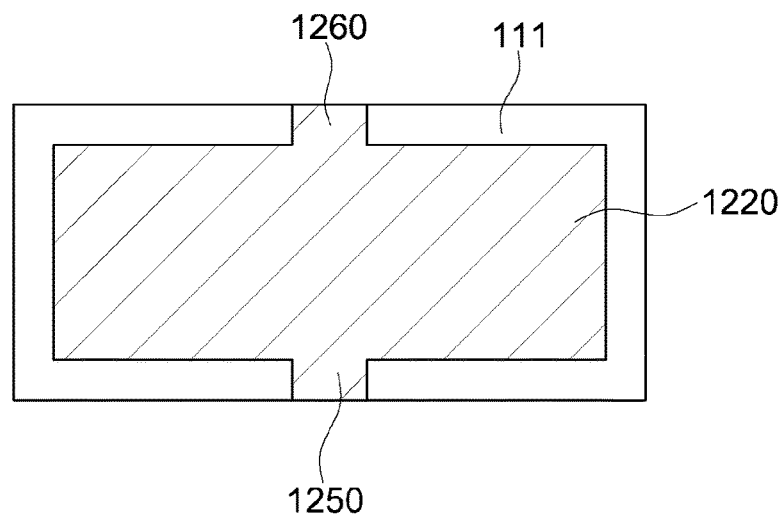

FIG. 12 is a perspective view illustrating another example of an external electrode of the multilayer ceramic capacitor according to an exemplary embodiment of the present disclosure; and FIGS. 13A and 13B are plan views illustrating another example of first and second internal electrodes of the multilayer ceramic capacitor of FIG. 12.

Here, since a structure of the ceramic body 110 is the same as that of the foregoing exemplary embodiment of the present disclosure, a detailed description thereof will be omitted so as to avoid an overlapping description, and first to third external electrodes 1310 to 1330 and first and second internal electrodes 1210 and 1220 having a structure different from that of the foregoing exemplary embodiment of the present disclosure will be described in detail.

Referring to FIGS. 12 through 13B, the first to third external electrodes 1310, 1320, and 1330 may be formed on the bottom surfaces of the ceramic body 110 and may be extended to portions of the third and fourth side surfaces S5 and S6 of the ceramic body 110, respectively, as needed. Further, the fourth to sixth external electrodes 1310', 1320' and 1330' may be formed on the top surfaces of the ceramic body 110 in a symmetrical form in which they oppose to the first to third external electrodes 1310, 1320 and 1330 and may be extended to portions of the third and fourth side surfaces S5 and S6 of the ceramic body 110, respectively, as needed.

In addition, the first internal electrode 1210 may include first and second lead-out portions 1230 and 1240 exposed through the bottom surface of the ceramic body 110 to thereby be electrically connected to the first and second external electrodes 1310 and 1320, respectively.

In addition, the first internal electrode 1210 may include fourth and fifth lead-out portions 1230' and 1240' exposed through the top surface of the ceramic body 110 to thereby be electrically connected to the fourth and fifth external electrodes 1310' and 1320' formed on the top surface of the ceramic body 110, respectively.

Here, the first internal electrode 1210 may include space portions 1231 and 1241 formed on both end portions thereof in the length direction.

The second internal electrode 1220 may include a third lead-out portion 1250 exposed through the bottom surface of the ceramic body 110 between the first and second lead-out portions 1230 and 1240 to thereby be electrically connected to the third external electrode 1330 and a sixth lead-out portion 1260 exposed through the top surface of the ceramic body 110 between the fourth and fifth lead-out portions 1230' and 1240' to thereby be electrically connected to the sixth external electrode 1330'.

Board for Mounting of Multilayer Ceramic Capacitor

Figure 14:
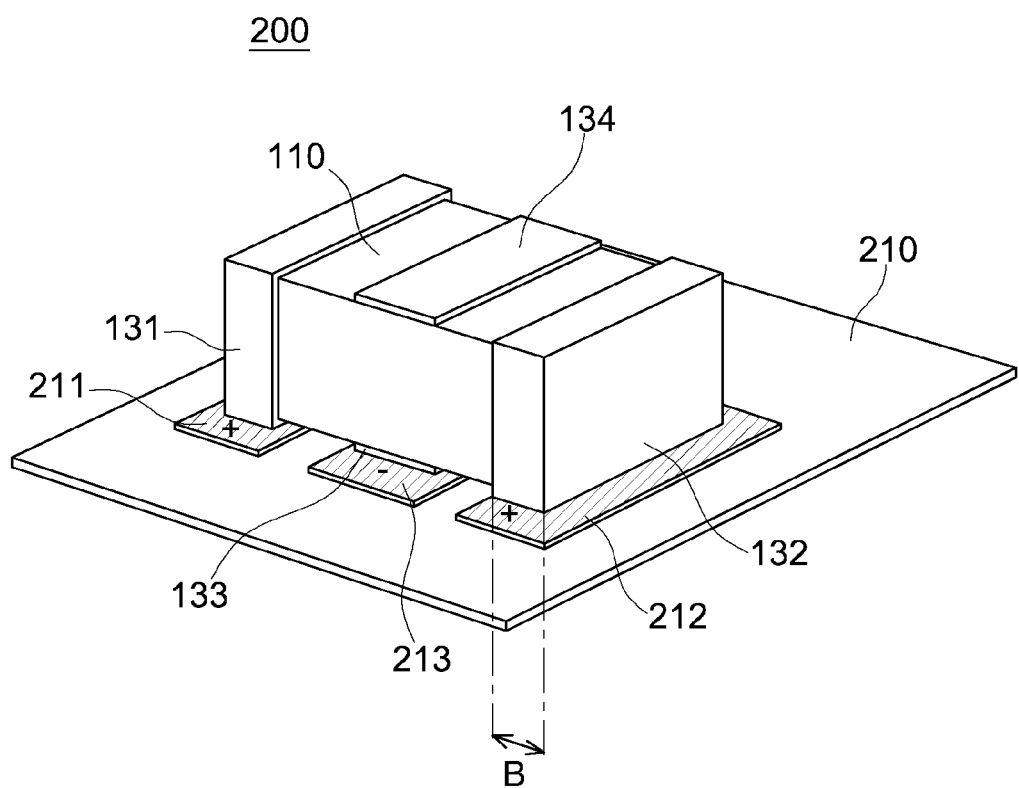
FIG. 14 is a perspective view schematically illustrating a form in which the multilayer ceramic capacitor according to an exemplary embodiment of the present disclosure is mounted on a printed circuit board.

FIG. 14 is a perspective view schematically illustrating a form in which the multilayer ceramic capacitor according to an exemplary embodiment of the present disclosure is mounted on a printed circuit board.

Referring to FIG. 14, a board 200 for mounting of a multilayer ceramic capacitor according to the exemplary embodiment of the present disclosure may include a substrate 210 on which the multilayer ceramic capacitor 100 is mounted, and first to third electrode pads 211 to 213 formed on an upper surface of the substrate 210 so as to be spaced apart from each other.

Here, the multilayer ceramic capacitor may be electrically connected to the substrate 210 by solders (not shown) in a state in which the first main surface S1 of the ceramic body 110 in the thickness direction, which is amounting surface, is disposed to be provided as a lower surface thereof at the time of mounting thereof on the board 210, and in a state in which lower surfaces of the first to third external electrodes 131 to 133 are positioned on the first to third electrode pads 211 to 213 so as to contact the first to third electrode pads 211 to 213, respectively.

In the multilayer ceramic capacitor 100 according to the present exemplary embodiment, since the first and second internal electrodes are disposed perpendicularly to the substrate 210, a current flows from the first to third electrode pads 211 to 213 disposed on the substrate 210 to be adjacent to one another to the first and second internal electrodes 121 and 122 through the first to third external electrodes 131 to 133, such that a current path may be shortened.

Therefore, according to an exemplary embodiment of the present disclosure, an ESL value may be decreased as compared with a multilayer ceramic capacitor having a structure of internal electrodes disposed horizontally to the substrate, for example, a printed circuit board and a structure of external electrodes disposed to correspond thereto. The ESL value may be further decreased as the number of stacked internal electrodes is increased.

As an application example, in the case in which the multilayer ceramic capacitor is used as a three-terminal EMI filter, the first and second external electrodes may be connected to input and output terminals of a signal line, respectively, and the third external electrode may be connected to a ground terminal to remove high frequency noise of the signal line.

In this case, the first and second electrode pads 211 and 212, which are positive (+) poles, may correspond to the input/output terminals, respectively, and the third electrode pad 213, which is a negative (−) pole, may correspond to the ground terminal.

As another application example, in the case in which the multilayer ceramic capacitor is used as a decoupling capacitor, the first and second external electrodes may be connected to a power supply line and the third external electrode may be connected to a ground line to stabilize a power supply circuit.

In this case, the first and second electrode pads 211 and 212 may correspond to the power supply line and the third electrode pad 213 may correspond to the ground line.

Meanwhile, although a form in which the multilayer ceramic capacitor of FIG. 1 is mounted on the printed circuit board has been shown in FIG. 14, the present disclosure is not limited thereto. For example, the multilayer ceramic capacitors illustrated in FIGS. 8, 10, and 12 may also be mounted on the printed circuit board in a similar structure to configure the board having a multilayer ceramic capacitor mounted thereon.

According to exemplary embodiments of the present disclosure, since ESL of the multilayer ceramic capacitor may be decreased, in the case in which the multilayer ceramic capacitor is used as a decoupling capacitor, an EMI filter, or the like, voltage variation of a power supply circuit may be more effectively suppressed, and high frequency attenuation characteristics and a high frequency noise removing effect may be improved.

In addition, parts in which the dielectric layers formed using ceramic materials having high coupling force contact each other may be secured in the corner portions of the ceramic body and both end surfaces of the ceramic body in the length direction, whereby occurrence of delamination in the corner portions of the ceramic body and both end surfaces of the ceramic body in the length direction may be prevented While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor comprising:
a ceramic body including a plurality of dielectric layers stacked in a width direction;
a plurality of first and second internal electrodes alternately disposed to have a respective dielectric layer interposed between the first and second internal electrodes;
first and second lead-out portions each having one or more space portions and extended from the first internal electrode to be exposed through a mounting surface of the ceramic body and spaced apart from each other in the length direction of the ceramic body;
a third lead-out portion extended from the second internal electrode to be exposed through the mounting surface of the ceramic body and disposed between the first and second lead-out portions;
first and second external electrodes disposed on the mounting surface of the ceramic body to be spaced apart from each other in the length direction of the ceramic body and connected to the first and second lead-out portions, respectively; and
a third external electrode disposed between the first and second external electrodes and connected to the third lead-out portion,
wherein a total area of the space portions included in the first lead-out portion is S2 and an area corresponding to the sum of an area of the first lead-out portion and S2 is S1, and S2/S1 ranges from 10.0% to 90.1%, and
a total area of the space portions included in the second lead-out portion is S2' and an area corresponding to the sum of an area of the second lead-out portion and S2' is S1', and S2'/S1' ranges from 10.0% to 90.1%.

2. A multilayer ceramic capacitor comprising:
a ceramic body including a plurality of dielectric layers stacked in a width direction;
a plurality of first and second internal electrodes alternately disposed to have a respective dielectric layer interposed between the first and second internal electrodes;
first and second lead-out portions each having one or more space portions and extended from the first internal electrode to be exposed through a mounting surface of the ceramic body and spaced apart from each other in the length direction of the ceramic body;
a third lead-out portion extended from the second internal electrode to be exposed through the mounting surface of the ceramic body and disposed between the first and second lead-out portions;
first and second external electrodes disposed on the mounting surface of the ceramic body to be spaced apart from each other in the length direction of the ceramic body and connected to the first and second lead-out portions, respectively; and
a third external electrode disposed between the first and second external electrodes and connected to the third lead-out portion,
wherein a minimum width of the first lead-out portion exposed to the mounting surface of the ceramic body is A and a width of the first external electrode formed on the mounting surface of the ceramic body is B, and 36 µm≤A≤100.1 µm and A≤B, and
a width of the second lead-out portion exposed to the mounting surface of the ceramic body is A' and a width of the second external electrode formed on the mounting surface of the ceramic body is B', and 36 µm≤A'≤100.1 µm and A'≤B'.

3. The multilayer ceramic capacitor of claim 1, wherein the first and second lead-out portions are extended from the first internal electrode to be exposed through a surface of the ceramic body opposing the mounting surface of the ceramic body and both end surfaces of the ceramic body in the length direction,
the first and second external electrodes are disposed on both end surfaces of the ceramic body in the length direction, respectively, and are extended from both end surfaces of the ceramic body in the length direction to portions of both side surfaces of the ceramic body in the width direction and a portion of the surface of the ceramic body opposing the mounting surface of the ceramic body, and
the second internal electrode is disposed to be spaced apart from both end surfaces of the ceramic body in the length direction.

4. The multilayer ceramic capacitor of claim 1, further comprising:
a fourth lead-out portion extended from the second internal electrode to be exposed through a surface of the ceramic body opposing the mounting surface of the ceramic body and disposed between the first and second lead-out portions; and
a fourth external electrode disposed between the first and second external electrodes, extended from the surface of the ceramic body opposing the mounting surface of the ceramic body to portions of both side surfaces of the ceramic body in the width direction, and connected to the fourth lead-out portion.

5. The multilayer ceramic capacitor of claim 1, wherein the first and second internal electrodes are disposed to be spaced part from both end surfaces of the ceramic body in the length direction.

6. The multilayer ceramic capacitor of claim 5, wherein the first to third external electrodes are extended from the mounting surface of the ceramic body to portions of both side surfaces of the ceramic body in the width direction.

7. The multilayer ceramic capacitor of claim 5, further comprising:
fourth and fifth lead-out portions extended from the first internal electrode to be exposed through a surface of the ceramic body opposing the mounting surface of the ceramic body and disposed be spaced apart from each other in the length direction of the ceramic body;
a sixth lead-out portion extended from the second internal electrode to be exposed through the surface of the ceramic body opposing the mounting surface of the ceramic body and disposed between the fourth and fifth lead-out portions; and
an insulating layer disposed on the surface of the ceramic body opposing the mounting surface of the ceramic body.

8. The multilayer ceramic capacitor of claim 5, further comprising:
fourth and fifth lead-out portions extended from the first internal electrode to be exposed through a surface of the ceramic body opposing the mounting surface of the ceramic body and disposed to be spaced apart from each other in the length direction of the ceramic body;
a sixth lead-out portion extended from the second internal electrode so as to be exposed through the surface of the ceramic body opposing the mounting surface of the ceramic body and disposed between the fourth and fifth lead-out portions;

fourth and fifth external electrodes disposed on the surface of the ceramic body opposing the mounting surface of the ceramic body so as to be spaced apart from each other in the length direction of the ceramic body and connected to the fourth and fifth lead-out portions, respectively; and a sixth external electrode disposed between the fourth and fifth external electrodes, extended from the surface of the ceramic body opposing the mounting surface of the ceramic body to portions of both side surfaces of the ceramic body in the width direction, and connected to the sixth lead-out portion.

9. The multilayer ceramic capacitor of claim 1, wherein the space portion provided in the first or second lead-out portion is exposed through one end surface of the ceramic body in the length direction.

10. The multilayer ceramic capacitor of claim 9, wherein the space portion provided in the first or second lead-out portion is provided in a corner portion connecting a surface of the ceramic body opposing the mounting surface of the ceramic body and one end surface of the ceramic body in the length direction to each other.

11. The multilayer ceramic capacitor of claim 9, wherein the space portion provided in the first or second lead-out portion is exposed through a corner portion connecting the surface of a ceramic body opposing the mounting surface of the ceramic body and one end surface of the ceramic body in the length direction to each other and one end surface of the ceramic body in the length direction.

12. The multilayer ceramic capacitor of claim 1, wherein the third lead-out portion has a space portion exposed through the mounting surface of the ceramic body.

13. The multilayer ceramic capacitor of claim 4, wherein the fourth lead-out portion has a space portion exposed through the surface of the ceramic body opposing the mounting surface of the ceramic body.

14. A board for mounting of a multilayer ceramic capacitor, comprising:
a substrate on which first to third electrode pads are disposed; and
the multilayer ceramic capacitor of claim 1 including the first to third external electrodes disposed on the first to third electrode pads, respectively.

15. The multilayer ceramic capacitor of claim 2, wherein the first and second lead-out portions are extended from the first internal electrode to be exposed through a surface of the ceramic body opposing the mounting surface of the ceramic body and both end surfaces of the ceramic body in the length direction,
the first and second external electrodes are disposed on both end surfaces of the ceramic body in the length direction, respectively, and are extended from both end surfaces of the ceramic body in the length direction to portions of both side surfaces of the ceramic body in the width direction and a portion of the surface of the ceramic body opposing the mounting surface of the ceramic body, and
the second internal electrode is disposed to be spaced apart from both end surfaces of the ceramic body in the length direction.

16. The multilayer ceramic capacitor of claim 2, further comprising:
a fourth lead-out portion extended from the second internal electrode to be exposed through a surface of the ceramic body opposing the mounting surface of the ceramic body and disposed between the first and second lead-out portions; and
a fourth external electrode disposed between the first and second external electrodes, extended from the surface of the ceramic body opposing the mounting surface of the ceramic body to portions of both side surfaces of the ceramic body in the width direction, and connected to the fourth lead-out portion.

17. The multilayer ceramic capacitor of claim 2, wherein the first and second internal electrodes are disposed to be spaced part from both end surfaces of the ceramic body in the length direction.

18. The multilayer ceramic capacitor of claim 17, wherein the first to third external electrodes are extended from the mounting surface of the ceramic body to portions of both side surfaces of the ceramic body in the width direction.

19. The multilayer ceramic capacitor of claim 17, further comprising:
fourth and fifth lead-out portions extended from the first internal electrode to be exposed through a surface of the ceramic body opposing the mounting surface of the ceramic body and disposed be spaced apart from each other in the length direction of the ceramic body;
a sixth lead-out portion extended from the second internal electrode to be exposed through the surface of the ceramic body opposing the mounting surface of the ceramic body and disposed between the fourth and fifth lead-out portions; and
an insulating layer disposed on the surface of the ceramic body opposing the mounting surface of the ceramic body.

20. The multilayer ceramic capacitor of claim 17, further comprising:
fourth and fifth lead-out portions extended from the first internal electrode to be exposed through a surface of the ceramic body opposing the mounting surface of the ceramic body and disposed to be spaced apart from each other in the length direction of the ceramic body;
a sixth lead-out portion extended from the second internal electrode so as to be exposed through the surface of the ceramic body opposing the mounting surface of the ceramic body and disposed between the fourth and fifth lead-out portions;
fourth and fifth external electrodes disposed on the surface of the ceramic body opposing the mounting surface of the ceramic body so as to be spaced apart from each other in the length direction of the ceramic body and connected to the fourth and fifth lead-out portions, respectively; and
a sixth external electrode disposed between the fourth and fifth external electrodes, extended from the surface of the ceramic body opposing the mounting surface of the ceramic body to portions of both side surfaces of the ceramic body in the width direction, and connected to the sixth lead-out portion.

21. The multilayer ceramic capacitor of claim 2, wherein the space portion provided in the first or second lead-out portion is exposed through one end surface of the ceramic body in the length direction.

22. The multilayer ceramic capacitor of claim 21, wherein the space portion provided in the first or second lead-out portion is provided in a corner portion connecting a surface of the ceramic body opposing the mounting surface of the ceramic body and one end surface of the ceramic body in the length direction to each other.

23. The multilayer ceramic capacitor of claim 21, wherein the space portion provided in the first or second lead-out portion is exposed through a corner portion connecting the surface of a ceramic body opposing the mounting surface of the ceramic body and one end surface of the ceramic body in the length direction to each other and one end surface of the ceramic body in the length direction.

24. The multilayer ceramic capacitor of claim 2, wherein the third lead-out portion has a space portion exposed through the mounting surface of the ceramic body.

25. The multilayer ceramic capacitor of claim 16, wherein the fourth lead-out portion has a space portion exposed through the surface of the ceramic body opposing the mounting surface of the ceramic body.

26. A board for mounting of a multilayer ceramic capacitor, comprising:
 a substrate on which first to third electrode pads are disposed; and
 the multilayer ceramic capacitor of claim 2 including the first to third external electrodes disposed on the first to third electrode pads, respectively.

* * * * *